(12) United States Patent
Kondo et al.

(10) Patent No.: US 8,342,863 B2
(45) Date of Patent: Jan. 1, 2013

(54) CONNECTOR AND PRINTED CIRCUIT BOARD FOOT PATTERN FOR A CONNECTOR

(75) Inventors: Hayato Kondo, Yao (JP); Toshiharu Miyoshi, Yao (JP)

(73) Assignee: Hosiden Corporation, Yao-shi (JP)

( * ) Notice: Subject to any disclaimer, the term of this patent is extended or adjusted under 35 U.S.C. 154(b) by 1 day.

(21) Appl. No.: 13/074,324

(22) Filed: Mar. 29, 2011

(65) Prior Publication Data
US 2011/0244730 A1  Oct. 6, 2011

(30) Foreign Application Priority Data
Mar. 31, 2010 (JP) .................................. 2010-80630

(51) Int. Cl.
*H01R 24/00* (2006.01)

(52) U.S. Cl. ........................................ 439/108; 439/660

(58) Field of Classification Search .................. 439/108, 439/101, 660
See application file for complete search history.

(56) References Cited

U.S. PATENT DOCUMENTS

| 5,743,750 A * | 4/1998 | Sullivan et al. ............... 439/76.1 |
| 6,346,010 B1 * | 2/2002 | Emplit ...................... 439/620.17 |
| 2003/0186580 A1 | 10/2003 | Dambach et al. |

FOREIGN PATENT DOCUMENTS

| EP | 2 015 402 | 1/2009 |
| EP | 2 202 850 | 6/2010 |
| JP | 2005-149770 | 6/2005 |

* cited by examiner

*Primary Examiner* — Gary F. Paumen
(74) *Attorney, Agent, or Firm* — Rankin, Hill & Clark LLP

(57) ABSTRACT

A connector, and printed circuit board foot pattern for a connector which can efficiently transmit a high-speed differential signal are provided. In a connector 1, a contact group 30 includes at least paired adjacent signal contacts SC-SC, and non-paired contacts GC which are placed on both adjacent sides or one adjacent side of the paired signal contacts. The contacts are arranged so that the distance W1 between the paired signal contacts SC-SC is shorter than the distance W2 between adjacent signal and non-paired contacts SC-GC, thereby enhancing the differential coupling force between the paired signal contacts SC-SC.

4 Claims, 12 Drawing Sheets

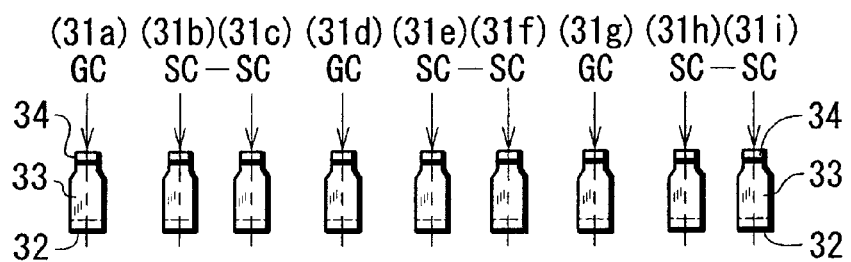
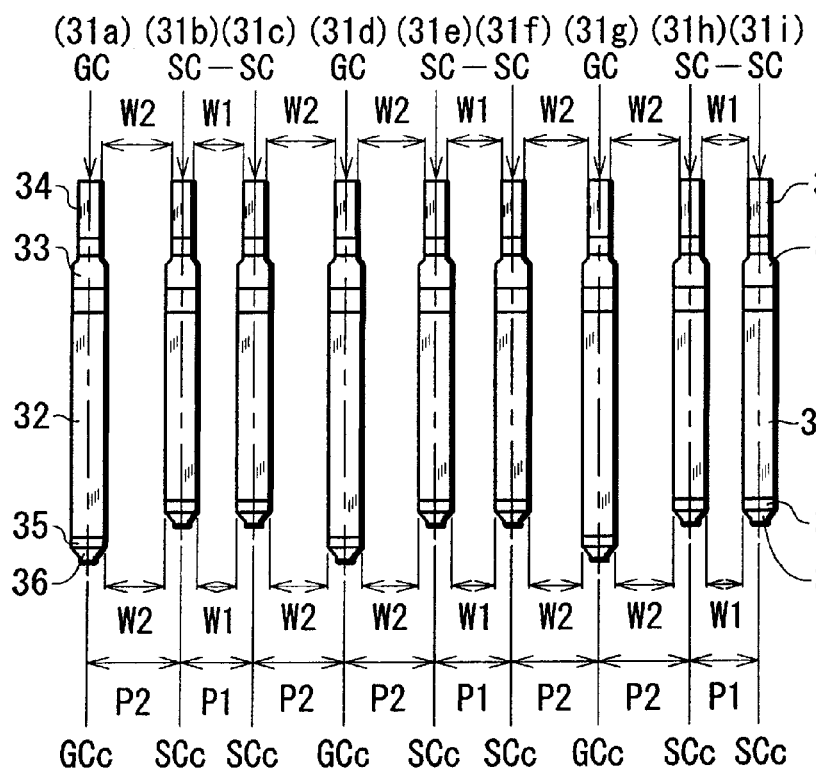 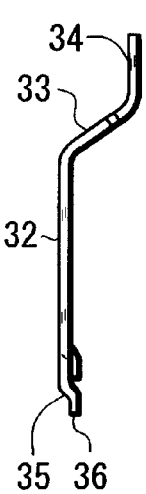

CONNECTOR AND PRINTED CIRCUIT BOARD FOOT PATTERN FOR A CONNECTOR

TECHNICAL FIELD

The present invention relates to a connector for transmitting a high-speed differential signal, and also to a printed circuit board foot pattern for a connector.

BACKGROUND ART

Conventionally, a connector includes a contact group, and an insulator which holds the contact group. Each of contacts constituting the contact group has a terminal portion which is to be connected to a connection object, and a contact portion which is to be connected to a counter contact. In the range extending from the terminal portion to the contact portion, the contacts are in parallel in the fitting/unfitting direction of the connector and the counter connector. The contacts are arranged at equal pitch in the pitch direction which is perpendicular to the fitting/unfitting direction so that the distances between adjacent contacts are equal to one another. The arrangement of the contacts at equal pitch supports the cost reduction, improvement of the productivity, miniaturization, and pitch reduction of the connector.

In the differential transmission, when the distance between paired (differential pair) adjacent signal contacts is equal to that between a non-paired contact (i.e., a contact except contacts constituting a contact pair) which is placed on both adjacent sides or one adjacent side of the paired signal contacts, and one of the signal contacts, however, the differential coupling force between the paired signal contacts is weakened by crosstalk from the signal contact to the non-paired contact, and disadvantages such as signal reflection and noise radiation are caused by impedance mismatching due to the connector, thereby producing a problem in that transmission cannot be efficiently conducted.

On the other hand, Patent Literature 1 discloses a configuration where terminal portions are arranged at equal pitch, and contact portions are placed so that the distance between contact portions of paired signal contacts is shorter than that between contact portions of external and signal contacts, thereby suppressing crosstalk to enhance the differential coupling force.

PRIOR ART LITERATURE

Patent Literature

[Patent Literature 1] Japanese Patent Application Laid-Open No. 2005-149770

SUMMARY OF THE INVENTION

Problem to be Solved by the Invention

Also in the configuration disclosed in Patent Literature 1, terminal portions are arranged at equal pitch. Therefore, the configuration is advantageous in cost reduction, miniaturization, and pitch reduction of the connector. However, also differential wirings which are configured so that paired differential lines are firmly differentially coupled with each other on the side of a printed circuit board or cable to which the connector is to be connected are inevitably arranged at equal pitch in the same manner as the terminal portion in the range which is in front of the connector. Therefore, the differential coupling force between the differential lines is weakened in a connection portion between the connector and the connection object, and there arises a problem in that transmission cannot be efficiently conducted.

The invention has been conducted in view of the above-discussed problem. It is an object of the invention to provide a connector and printed circuit board foot pattern for a connector which can efficiently transmit a high-speed differential signal.

Means for Solving the Problem

In order to attain the object, in a first invention, a connector includes a contact group, and an insulator which holds the contact group, the contact group includes at least paired adjacent signal contacts, and non-paired contacts which are placed on both adjacent sides or one adjacent side of the paired signal contacts, each of the paired signal contacts and the non-paired contacts has a terminal portion which is to be connected to a connection object, and a contact portion which is to be connected to a counter contact, the paired signal contacts and the non-paired contacts are, in a range extending from the terminal portion to the contact portion, in parallel to a fitting/unfitting direction of the connector and the counter connector, and arranged in a pitch direction which is perpendicular to the fitting/unfitting direction so that a distance between the paired signal contacts is shorter than a distance between the signal contact and the non-paired contact, and the non-paired contacts are ground contacts.

In a second invention, in the connector of the first invention, the connection object is a printed circuit board having a foot pattern including a land group which is configured by metal foils, and which is to be solder connected to the contact group.

In a third invention, a printed circuit board foot pattern for a connector includes a land group which is configured by metal foils, and which is to be solder connected to a contact group of the connector, the land group includes at least paired adjacent signal lands, and external lands which are placed on both adjacent sides or one adjacent side of the paired signal lands, the paired signal lands and the external lands are arranged so that a distance between the paired signal lands is shorter than a distance between the signal land and the external land, and the external lands are ground lands.

Effect of the Invention

According to the first invention, in the connector, the paired signal contacts and the non-paired contacts are, in the range extending from the terminal portion to the contact portion, in parallel to the fitting/unfitting direction of the connector and the counter connector, and arranged in the pitch direction which is perpendicular to a fitting/unfitting direction so that the distance between the paired signal contacts is shorter than that between the signal contact and the non-paired contact. Therefore, crosstalk from the signal contact to the non-paired contact can be suppressed in the range extending from the terminal portion to the contact portion, the differential coupling force between the paired signal contacts can be enhanced in the range extending from the terminal portion to the contact portion, and, since the non-paired contacts are ground contacts, the crosstalk can be further suppressed. As a result, it is possible to provide a connector in which the differential coupling can be firmly maintained in a range extending from the connection portion (terminal portion) for a connection object that is outside the connector, to the connection portion (contact portion) for the counter connector in the connector, impedance mismatching due to the connector can be avoided, and a high-speed differential signal can be efficiently transmitted.

According to the second invention, the connection object is a printed circuit board having a foot pattern including a land group which is configured by metal foils, and which is to be solder connected to the contact group. Therefore, the land group includes at least paired adjacent signal lands, and external lands which are placed on both adjacent sides or one adjacent side of the paired signal lands, the paired signal lands and the external lands are arranged so that the distance between the paired signal lands is shorter than that between the signal land and the external land, and the external lands are ground lands. As a result, in a similar manner as the connector, it is possible to form a foot pattern in which a high-speed differential signal can be efficiently transmitted.

According to the third invention, in the printed circuit board foot pattern for a connector, the paired signal lands and the external lands are arranged so that the distance between the paired signal lands is shorter than that between the signal land and the external land. Therefore, crosstalk from the signal land to the external land can be suppressed, the differential coupling force between the paired signal lands can be enhanced, and, since the external lands are ground lands, the crosstalk can be further suppressed. As a result, it is possible to provide a printed circuit board foot pattern for a connector in which the differential coupling can be firmly maintained in a foot pattern portion which is a connection portion of a connector and a printed circuit board, impedance mismatching due to the foot pattern portion can be avoided, and a high-speed differential signal can be efficiently transmitted.

BRIEF DESCRIPTION OF THE DRAWINGS

FIG. 9 illustrates three views showing a contact group of the connector of the embodiment of the invention, (A) is a plan view, (B) is a back view, and (C) is a right side view.

MODE FOR CARRYING OUT THE INVENTION

Figure 1:
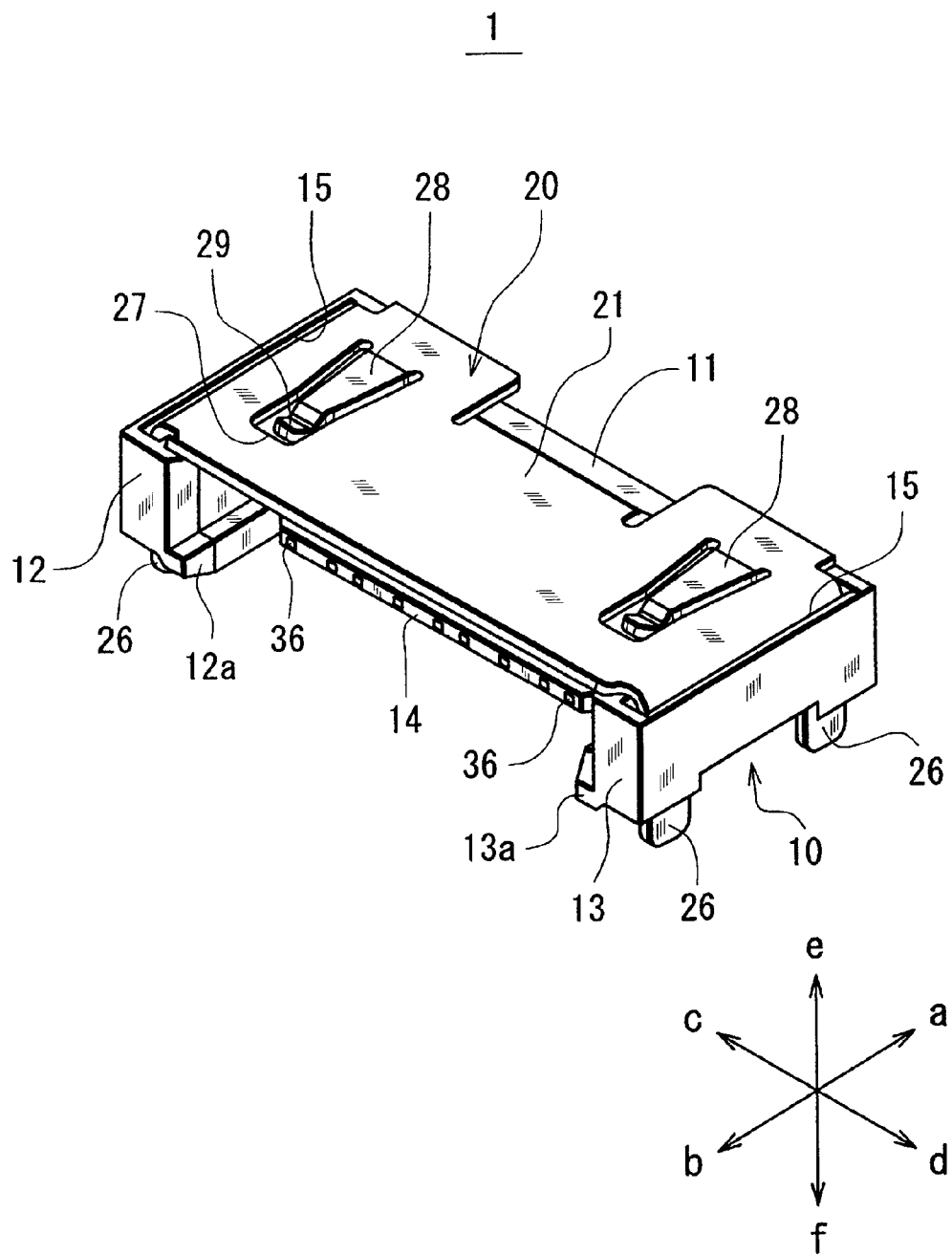
FIG. 1 is a perspective view showing plan, front, and right side faces of a connector of an embodiment of the invention.
Figure 2:
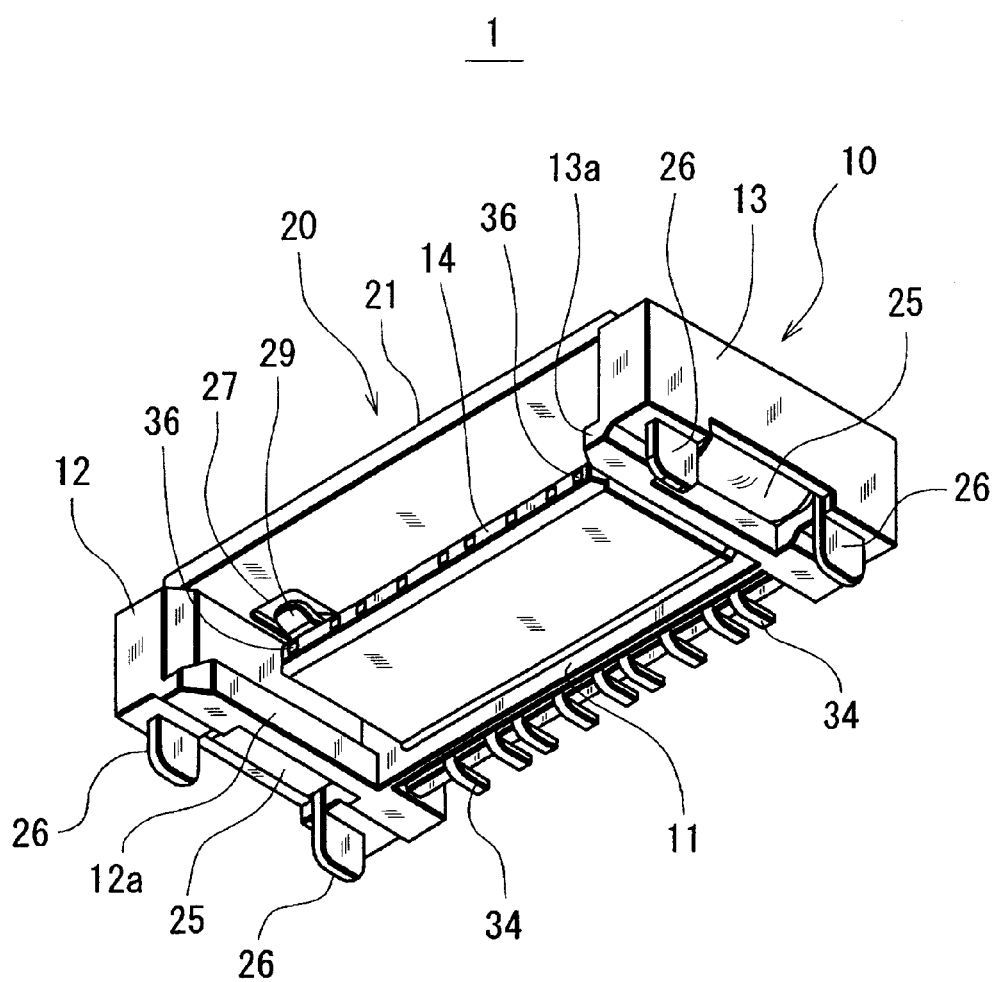
FIG. 2 is a perspective view showing bottom, front, and right side faces of the connector of the embodiment of the invention.
Figure 3:
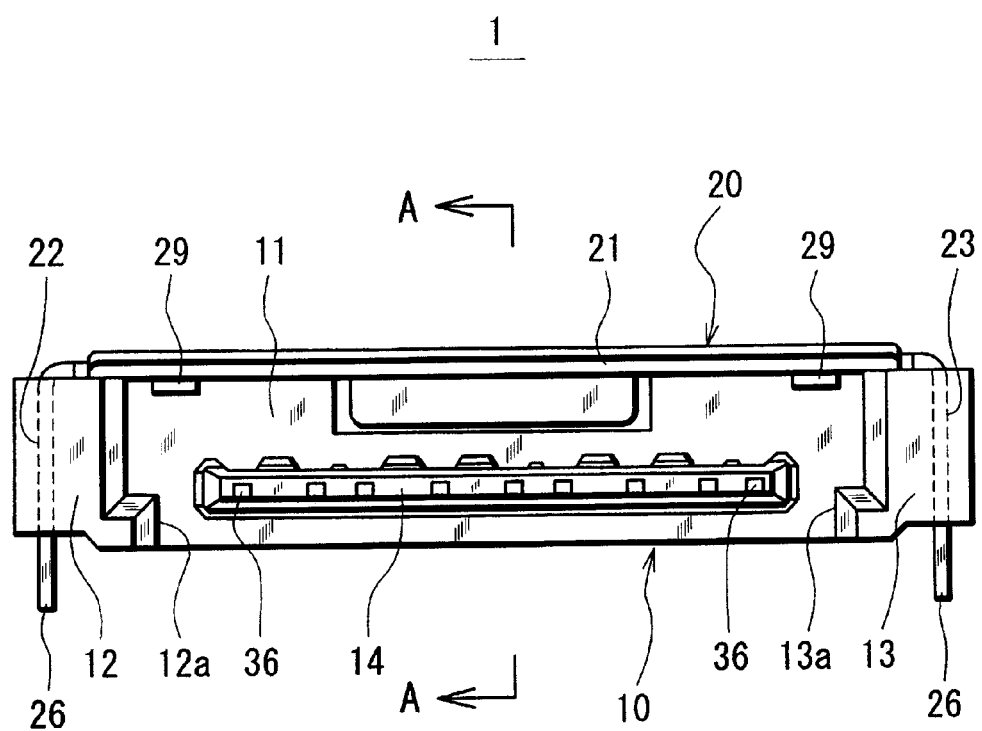
FIG. 3 is a front view of the connector of the embodiment of the invention.
Figure 4:
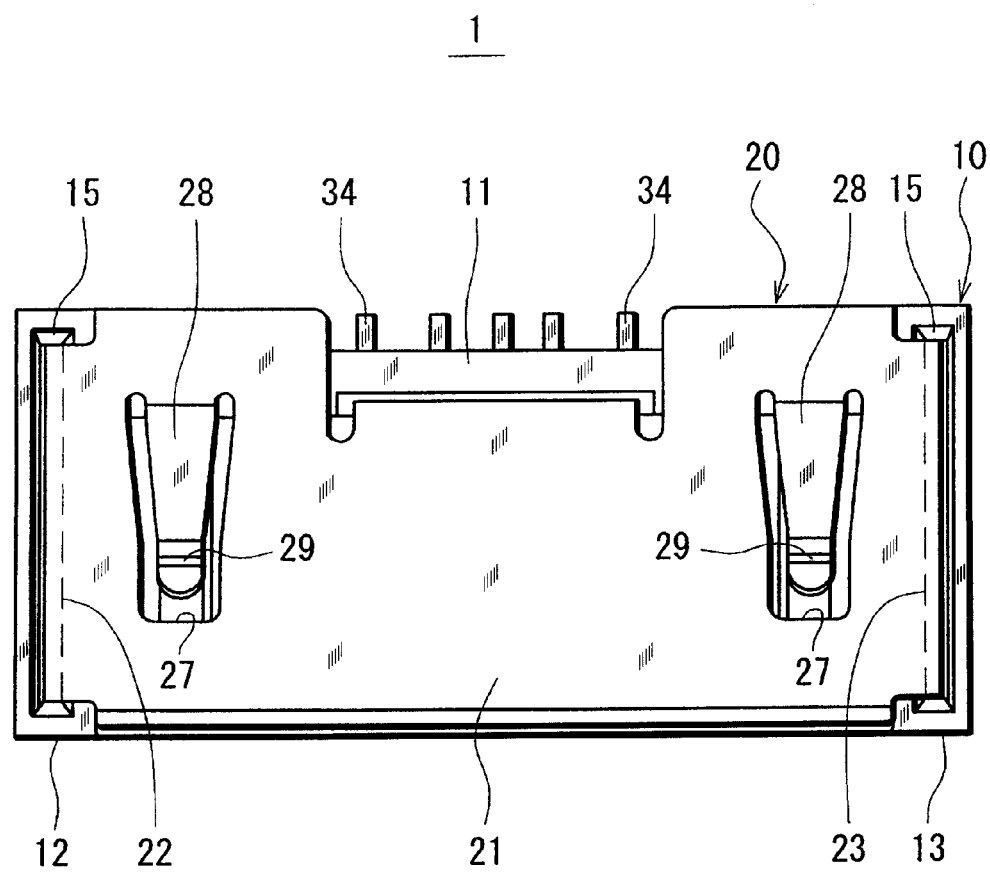
FIG. 4 is a plan view of the connector of the embodiment of the invention.
Figure 5:
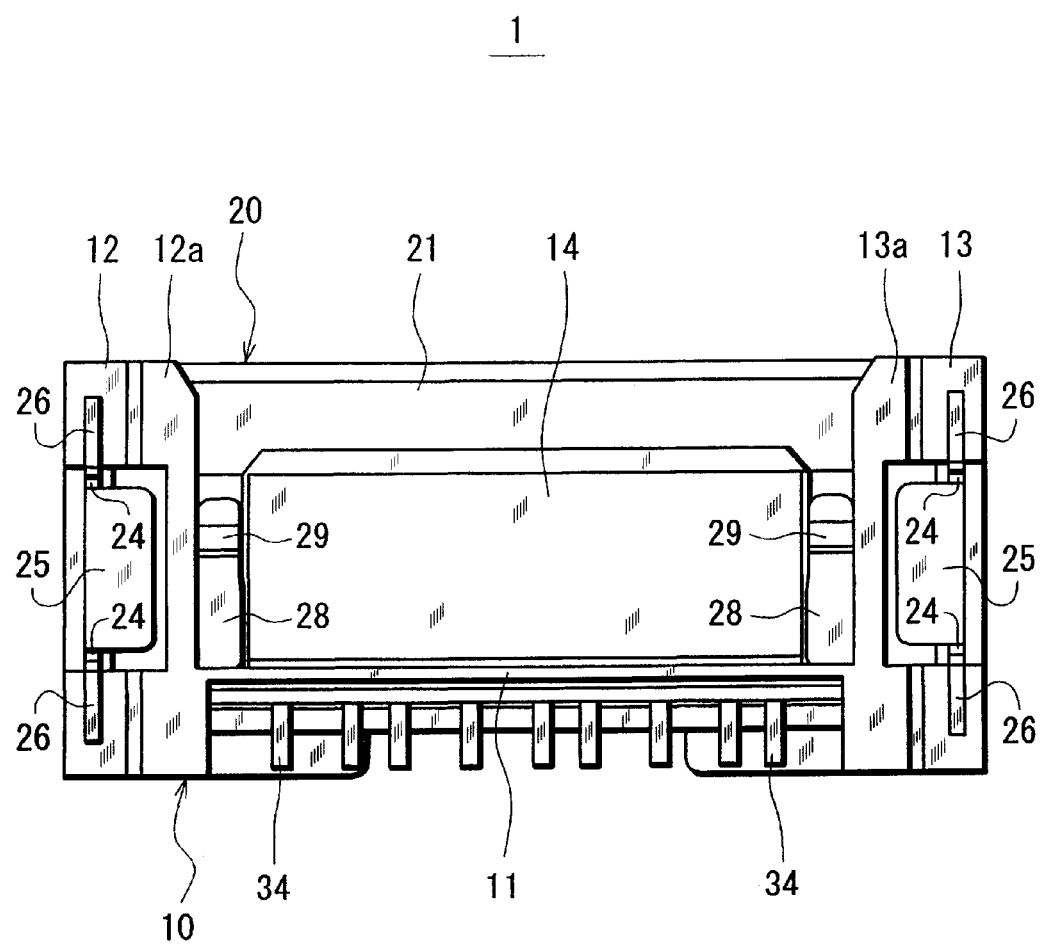
FIG. 5 is a bottom view of the connector of the embodiment of the invention.
Figure 6:
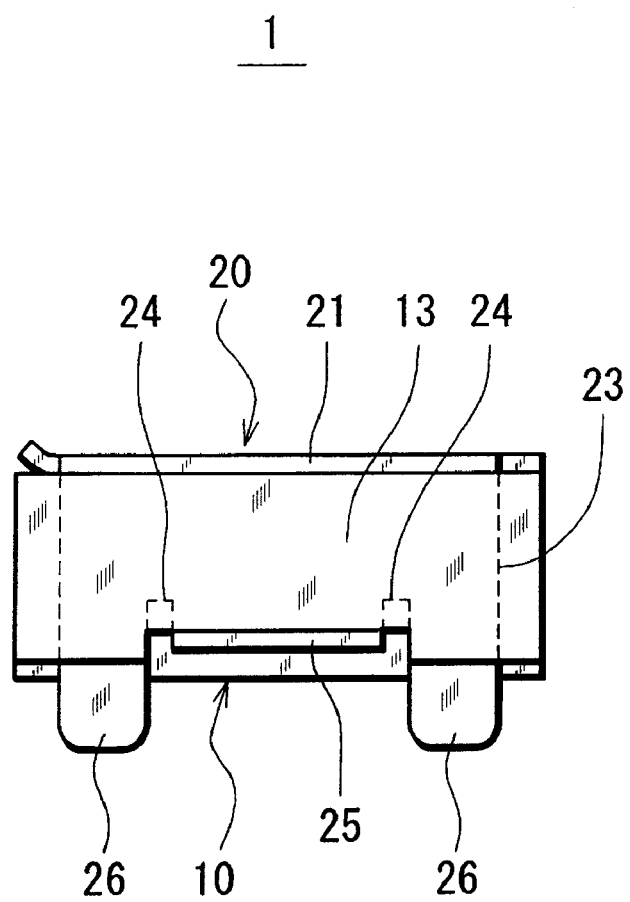
FIG. 6 is a right side view of the connector of the embodiment of the invention.
Figure 7:
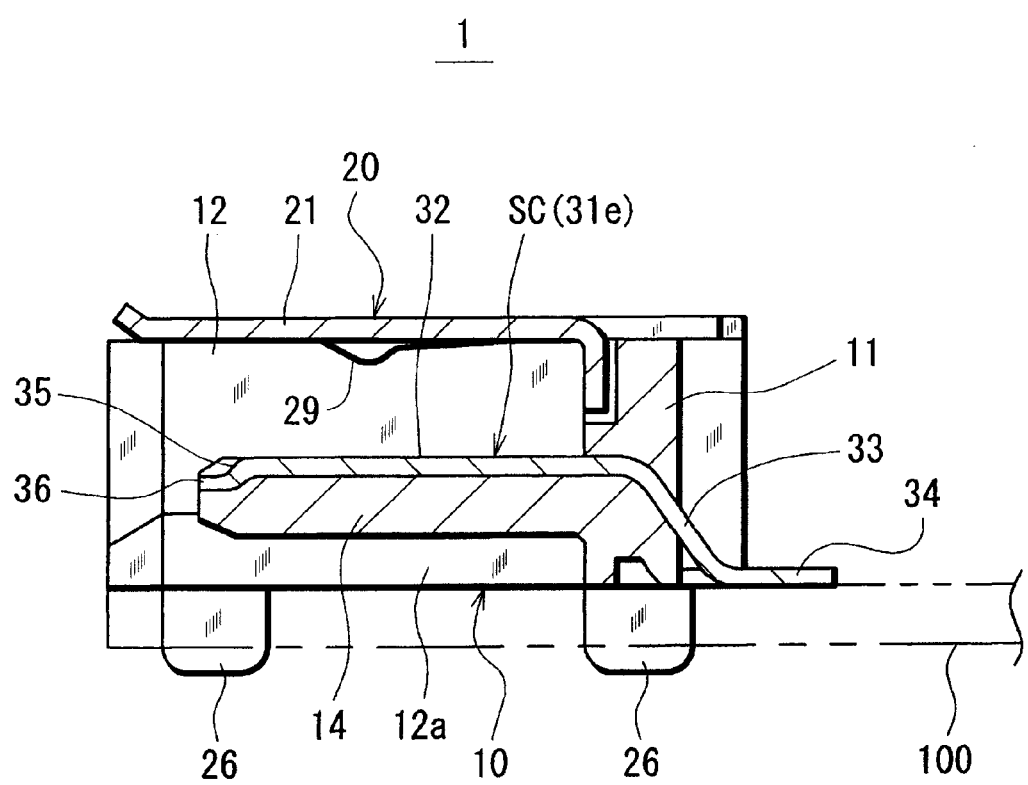
FIG. 7 is a sectional view of the connector of the embodiment of the invention, taken along line A-A in FIG. 3.
Figure 8:
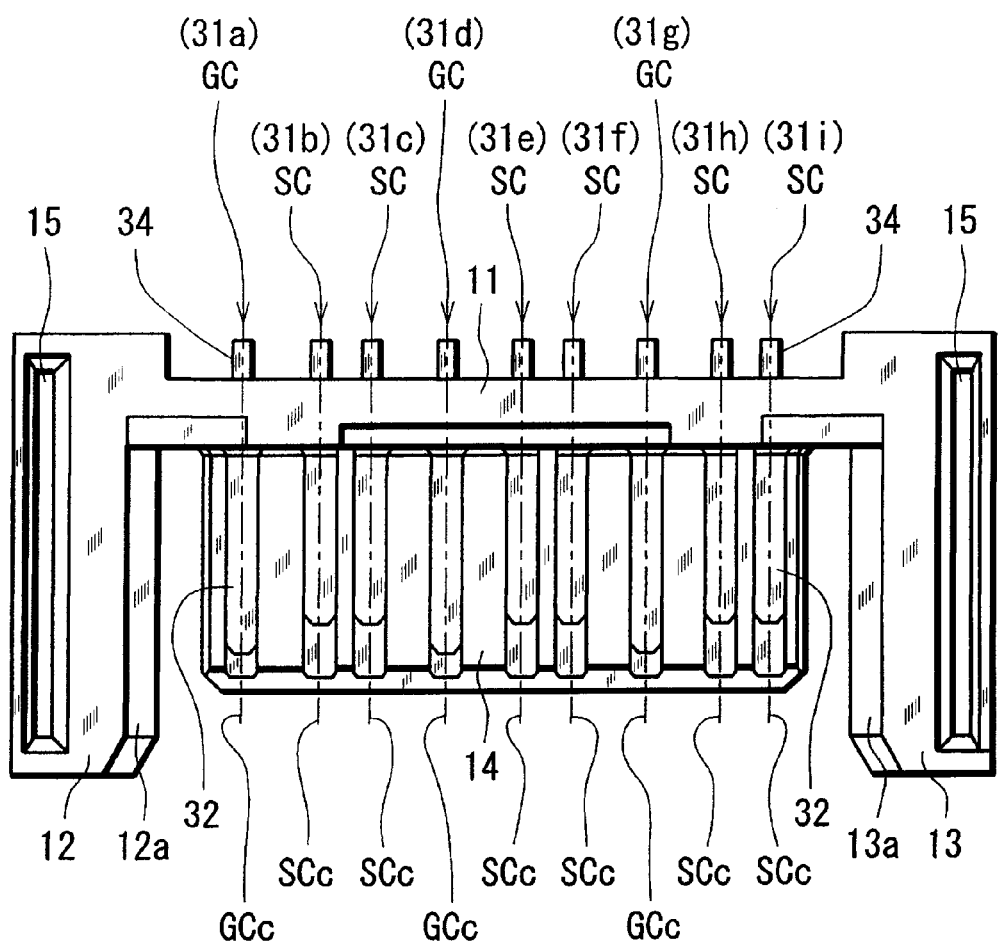
FIG. 8 is a plan view of the connector of the embodiment of the invention, making a cover of the connector transparent.

Hereinafter, a connector of an embodiment of the invention will be described with reference to FIGS. 1 to 9. The following description will be made while it is assumed that the direction of the arrow a-b in FIG. 1 coincides with the anteroposterior direction (longitudinal direction) of the connector, that of the arrow c-d coincides with the lateral direction (width direction) of the connector, and that of the arrow e-f coincides with the vertical direction (height direction) of the connector.

The connector 1 of the embodiment uses a plug which is disposed in an end of a cable connecting electronic apparatuses together, and which is not shown, as a counter connector, and is a receptacle which is to be mounted on a printed circuit board (PCB) 100 (see FIG. 7) of an electronic apparatus, and which is detachably fitted and connected to the counter connector, thereby allowing high-speed differential signals to be transmitted between the electronic apparatuses. The connector 1 of the embodiment is configured by a body 10 (an example of an insulator), a cover 20, and a contact group 30.

As shown in FIGS. 1 to 8, the body 10 is formed by a molded product made of an insulative material (plastic). In the body, a rear wall portion 11 of the connector 1, left and right side wall portions 12, 13 of the connector 1 which are forward protruded from left and right side parts of the front surface of the rear wall portion 11, respectively, and a contact supporting portion 14 which is forward protruded from a middle part of the front surface of the rear wall portion 11, which is placed between the left and right side wall portions 12, 13, and which has a rectangular plate like shape are integrally formed. The rear wall portion 11 functions also as a contact support basal portion.

In the left and right side wall portions 12, 13, rail portions 12a, 13a which are inward protruded from lower parts of the side wall portions are integrally formed. As seen from the front side of the connector 1, the left side wall portion 12 has an L-shaped sectional shape, and the right side wall portion 13 has a laterally-reversed L-shaped sectional shape. When the counter connector is to be inserted or extracted, the left and right side wall portions 12, 13 function also as guide rails. In each of the left and right side wall portions 12, 13, a through hole 15 which forms the side wall portion into a rectangular tubular shape is disposed.

As shown in FIGS. 1 to 7, the cover 20 is configured by a U-shaped metal plate which is downward opened. A top plate portion (upper plate portion) 21 of the connector 1, and left and right fixed plate portions 22, 23 which are bent and hung from the left and right side edges of the top plate portion 21 are integrally formed. The left and right fixed plate portions 22, 23 are inserted and fitted from the upper side into the through holes 15 disposed in the left and right side wall portions 12, 13, and the cover 20 is attached to the body 10 in a state where the area between the left and right side wall portions 12, 13 is covered from the upper side by the top plate portion 21.

When the cover 20 is attached, the lower parts of the left and right fixed plate portions 22, 23 are protruded to the lower surface sides of the left and right side wall portions 12, 13. In the lower part of each of the left and right fixed plate portions 22, 23, two slits 24 are disposed so that the lower part is divided into three metal pieces, i.e., front, middle, and rear metal pieces. The middle metal piece which is between the two slits 24 is an engaging piece 25, and the front and rear metal pieces which are in front and rear of the two slits 24 are two cover terminal portions 26, respectively.

The engaging pieces 25 are inward bent so as to be engaged with the lower surfaces of the left and right side wall portions 12, 13 after the left and right fixed plate portions 22, 23 are inserted and fitted into the through holes 15 disposed in the left and right side wall portions 12, 13, thereby preventing the cover 20 from slipping off. The cover terminal portions 26 are further downward protruded from the front and rear parts of the lower surfaces of the left and right side wall portions 12, 13.

In each of the right and left side parts of the top plate portion 21, a contact piece 28 configured by a cantilevered metal plate spring piece in which the rear end is a fixed end and the front end is a free end is disposed via a U-shaped notch 27 which is rearward opened. A mountain-like contacting portion 29 in which the lower surface is convex and the upper surface concave is formed in a front end portion of the contact piece 28, and an apex part of the contacting portion 29 is protruded toward the lower surface of the top plate portion 21.

In the above-described structure, the tip end of a fitting portion of the counter connector (hereinafter, referred to as "counter fitting portion") is inserted from the front side of the connector 1 between the front ends of the left and right side wall portions 12, 13, and the counter fitting portion is rearward (toward the rear side) pushed between the left and right side wall portions 12, 13, and then completely inserted between the left and right side wall portions 12, 13, whereby the connector 1 is fitted and connected to the counter connector. By contrast, when the counter connector which is fitted and connected is pulled toward the front side of the connector 1, so that the counter fitting portion is forward pulled out completely between the left and right side wall portions 12, 13 toward the front side of the connector 1, whereby the connector is separated from the counter connector. Namely, the connector 1 is fitted and separated with respect to the counter connector in the anteroposterior direction.

As shown in (A), (B), and (C) of FIG. 9, the contact group 30 includes nine (an example of the number which is equal to or larger than 3) individual contacts 31a to 31i (31a, 31b, 31c, 31d, 31e, 31f, 31g, 31h, and 31i in the sequence starting from the left end toward the right side in (A) and (B) of FIG. 9).

The nine contacts 31a to 31i are collectively formed by applying a punching process and a bending process on a metal plate having a high electrical conductivity. Each of the contacts has: a contact portion 32 having a rectangular plate like shape which is elongated in the anteroposterior direction; a support portion 33 which extends rearward and obliquely downward from the rear end of the contact portion 32 while maintaining the width; a terminal portion 34 which rearward extends from the inclined lower end of the support portion 33 while uniformly slightly reducing the width from the both sides; a downward step portion 35 which is formed in the vicinity of the front end of the contact portion 32; and an embedded portion 36 which is configured by a front end portion of the contact portion 32 that is on the front side of the step portion 35. The contact portion 32 is to be connected to a contact of the counter connector (hereinafter, referred to as "counter contact"), and the terminal portion 34 is to be connected to the printed circuit board 100.

In each of the nine contacts 31a to 31i, while assuming that one straight line extending in the anteroposterior direction is set as the X-axis, and one straight line extending in the vertical direction and perpendicular to the X-axis is as the Y-axis, the range from the front end (the embedded portion 36) of the contact portion 32 to the rear end of the terminal portion is formed plane-symmetrically by setting a plane containing the X-axis and the Y-axis as the symmetry plane.

In a range from the front end of the contact portion 32 to the rear end of the terminal portion 34, the nine contacts 31a to 31i are in parallel to the anteroposterior direction which coincides with the fitting/unfitting direction of the connector 1 and the counter connector, and arranged in the lateral direction which coincides with the pitch direction that is perpendicular to the fitting/unfitting direction.

The nine contacts 31a to 31i are collectively formed so as to respectively have a strip-like shape in which the rear end is connected to a carrier (not shown), integrated in the strip-like form with the body 10 by insert molding, and then separated from the carrier, so that the nine individual contacts 31a to 31i are attached to the body 10 as shown in FIGS. 1 to 8.

In the range from the front end of the contact portion 32 to the rear end of the terminal portion 34, the nine contacts 31a to 31i in the attached state are fixed and held to the body 10 in the state where the contacts are in parallel to the anteroposterior direction and arranged in the lateral direction. The support portions 33 are embedded in the plastic of the rear wall portion (contact support basal portion) 11, and arranged in one row in the lateral direction in the plastic of the rear wall portion 11. The contact portions 32 forward extend from the front surface of the rear wall portion 11 and on the upper surface of the contact supporting portion 14, and are arranged in one row in the lateral direction on the upper surface of the contact supporting portion 14 in a state where the upper surfaces of the contact portions 32 are exposed substantially flush with the upper surface of the contact supporting portion 14. The terminal portions 34 are rearward protruded from a lower part of the rear surface of the rear wall portion 11 so that the lower surfaces of the terminal portions 34 are substantially flush with the lower surface of the body 10, and arranged in one row in the lateral direction and outside the connector 1. The step portions 35 and the embedded portions 36 are embedded in the plastic of a front end part of the contact supporting portion 14, and arranged in one row in the lateral direction in the plastic of the front end part of the contact supporting portion 14.

The contact group 30 transmits three high-speed differential signals each using two adjacent contacts, and includes three pairs (an example of a plurality of pairs) of signal contacts, and three non-paired contacts which are placed on both adjacent sides or one adjacent side of the paired signal contacts, or a total of nine contacts 31a to 31i.

Among the nine contacts 31a to 31i, the two adjacent contacts 31b, 31c which are the second and third contacts from the left end, the two adjacent contacts 31e, 31f which are the fifth and sixth contacts from the left end, and the two adjacent contacts 31h, 31i which are the eighth and ninth (the right end) contacts from the left end are set as paired signal contacts SC-SC (differential pairs) for a differential signal. The remaining contacts, or the one contact 31a which is at the left end, the one contact 31d which is the fourth contact from the left end, and the one contact 31g which is the seventh contact from the left end are set as non-paired contacts GC. The paired signal contacts SC-SC and the non-paired contacts GC are arranged in a pattern of [GC●SC-SC●GC●SC-SC●GC●SC-SC]. One of the paired signal contacts SC-SC is in the + side (positive), and the other is in the − side (negative).

The arrangement pattern of the paired signal contacts SC-SC and the non-paired contacts GC is an example of: an arrangement pattern in which non-paired contacts GC are placed on both adjacent sides of paired signal contacts SC-SC, and paired signal contacts SC-SC are interposed between non-paired contacts GC; that in which a non-paired contact GC is placed on one adjacent side of paired signal contacts SC-SC; that in which, in the range from the front end of the contact portion 32 to the rear end of the terminal portion 34, a plurality of paired signal contacts SC-SC, SC-SC, . . . are laterally arranged in parallel to the anteroposterior direction; and that in which, in the range from the front end of the contact portion 32 to the rear end of the terminal portion 34, a plurality of paired signal contacts SC-SC, SC-SC, . . . are laterally arranged in parallel to the anteroposterior direction, and a non-paired contact GC is placed between paired adjacent signal contacts SC-SC and other paired signal contacts SC-SC.

In the arrangement pattern of the paired signal contacts SC-SC and the non-paired contacts GC, the paired signal contacts SC-SC and the non-paired contacts GC are placed (arranged) so that the distance W1 between the paired signal contacts SC-SC is shorter than the distance W2 between the adjacent signal and non-paired contacts SC-GC (W1<W2).

In other words, the relationship between the distance W1 between the paired signal contacts SC-SC and the distance W2 between the adjacent signal and non-paired contacts SC-GC can be said as follows.

In (A) of FIG. 9, SCc indicates the center line of each of the signal contacts SC, and GCc indicates the center line of each of the non-paired contacts. The paired signal contacts SC-SC and the non-paired contacts GC are placed (arranged) so that the pitch interval P1 which is the distance between the center lines SCc-SCc of the paired signal contacts SC-SC is shorter than the pitch interval P2 which is the distance between the center lines SCc-GCc of adjacent signal and non-paired contacts SC-GC (P1<P2).

The non-paired contacts GC are ground contacts for grounding.

In the above-described structure, the connector 1 includes the contact group 30, and the body 10 which is an insulator for holding the contact group 30, the contact group 30 includes at least paired adjacent signal contacts SC-SC, and non-paired contacts GC which are placed on the both adjacent sides or one adjacent side of the paired signal contacts SC-SC, each of the paired signal contacts SC-SC and the non-paired contacts GC has the terminal portion 34 which is to be connected to the printed circuit board 100 that is a connection object, and the contact portion 32 which is to be connected to the counter contact, the paired signal contacts and the non-paired contacts are, in the range extending from the terminal portion 34 to the contact portion 32, in parallel to the anteroposterior direction which is the fitting/unfitting direction of the connector 1 and the counter connector, and arranged in the lateral direction which is the pitch direction that is perpendicular to the fitting/unfitting direction so that the distance W1 between the paired signal contacts SC-SC is shorter than the distance W2 between adjacent signal and non-paired contacts SC-GC, i.e., at "irregular pitches", and the non-paired contacts GC are ground contacts.

Figure 10:
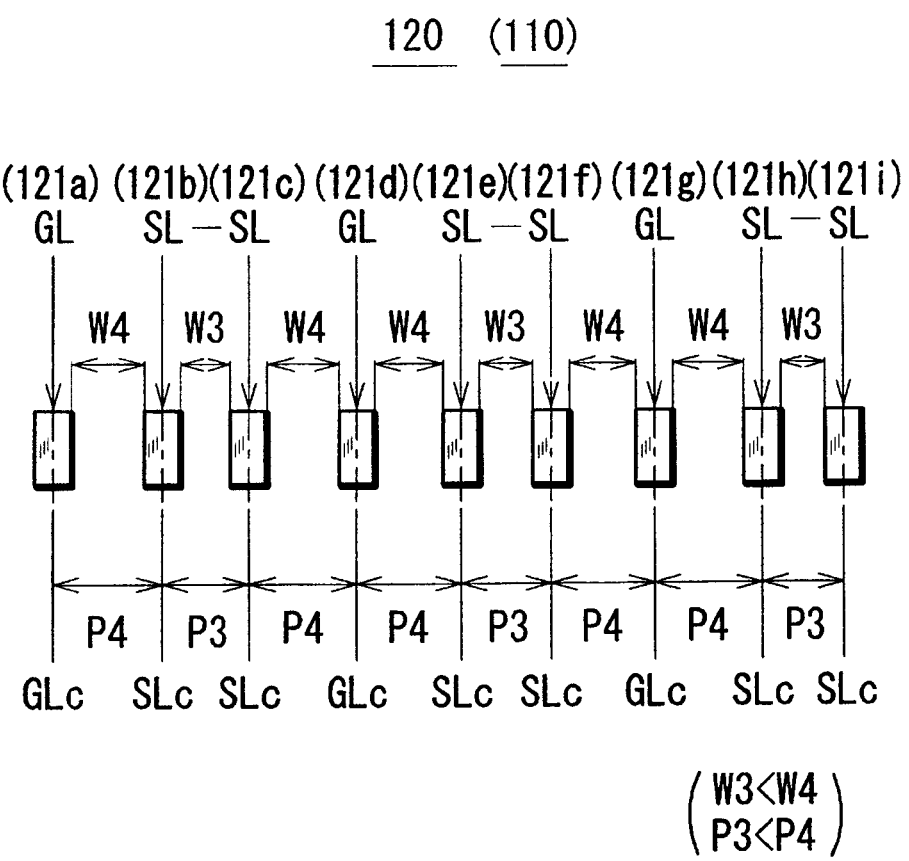
FIG. 10 is a plan view showing a printed circuit board foot pattern for a connector in the embodiment of the invention.

Next, the printed circuit board 100 onto which the thus configured connector 1 is to be mounted has a foot pattern 110 such as shown in FIG. 10, in a surface edge portion onto which the connector 1 is to be mounted.

As shown in FIG. 10, the foot pattern 110 includes a land group (pad group) 120 which is configured by metal foils such as copper foils, and which is to be solder connected to the contact group 30 of the connector 1. The land group 120 includes nine individual lands 121a to 121i (121a, 121b, 121c, 121d, 121e, 121f, 121g, 121h, and 121i in the sequence starting from the left end land toward the right side in FIG. 10) corresponding to the nine contacts 31a to 31i of the contact group 30. Each of the nine lands 121a to 121i is configured by a metal foil such as a copper foil, and to be solder connected to the terminal portion 34 of the corresponding one of the contacts 31a to 31i, and arranged in the same direction as the arrangement direction of the nine contacts 31a to 31i.

Similarly with the contact group 30, the land group 120 includes three pairs of signal lands, and three external lands which are placed on both adjacent sides or one adjacent side of the paired signal lands, or a total of nine lands 121a to 121i. Among the nine lands 121a to 121i, the two adjacent lands 121b, 121c which are the second and third lands from the left end, the two adjacent lands 121e, 121f which are the fifth and sixth lands from the left end, and the two adjacent contacts 121h, 121i which are the eighth and ninth (the right end) lands from the left end are set as paired signal lands SL (differential pairs) for a differential signal. The remaining lands, or the one land 121a which is at the left end, the one land 121d which is the fourth land from the left end, and the one land 121g which is the seventh land from the left end are set as external lands GL. Similarly with the paired signal contacts SC and the non-paired contacts GC, the paired signal lands SL-SL and the external lands GL are arranged in a pattern of "GL●SL-SL●GL●SL-SL●GL●SL-SL". One of the paired signal lands SL-SL is in the + side (positive), and the other is in the − side (negative).

Similarly with the arrangement pattern of the paired signal contacts SC-SC and the non-paired contacts GC, the arrangement pattern of the paired signal lands SL-SL and the external lands GL is an example of: an arrangement pattern in which external lands GL are placed on both adjacent sides of paired signal lands SL-SL, and paired signal lands SL-SL are interposed between external lands GL; that in which an external land GL is placed on one adjacent side of paired signal lands SL-SL; that in which a plurality of paired signal lands SL-SL, SL-SL, . . . are arranged in the same direction as the arrangement direction of the paired signal contacts SC-SC and the non-paired contacts GC; and that in which a plurality of paired signal lands SL-SL, SL-SL, . . . are arranged in the same direction as the arrangement direction of the paired signal contacts SC-SC and the non-paired contacts GC, and an external land GL is placed between paired adjacent signal lands SL-SL and other paired signal lands SL-SL.

Similarly with the arrangement pattern of the paired signal contacts SC-SC and the non-paired contacts GC, in the arrangement pattern of the paired signal lands SL-SL and the external lands GL, the paired signal lands SL-SL and the external lands GL are placed (arranged) so that the distance W3 between the paired signal lands SL-SL is shorter than the distance W4 between the adjacent signal and external lands SL-GL (W3<W4).

Similarly with the relationship between the distance W1 between the paired signal contacts SC-SC and the distance W2 between the adjacent signal and non-paired contacts SC-GC, that between the distance W3 between the paired signal lands SL-SL and the distance W4 between the adjacent signal and external lands SL-GL can be said as follows.

In FIG. 10, SLc indicates the center line of each of the signal lands SL, and GLc indicates the center line of each of the external lands. The paired signal lands SL-SL and the external lands GL are placed (arranged) so that the pitch interval P3 which is the distance between the center lines SLc-SLc of the paired signal lands SL-SL is shorter than the pitch interval P4 which is the distance between the center lines SLc-GLc of adjacent signal and external lands SL-GL (P3<P4). In the arrangement pattern of the paired signal contacts SC-SC and the non-paired contacts GC, and that of the paired signal lands SL-SL and the external lands GL, the pitch interval P1 and the pitch interval P3 are equal to each other (P1=P3), and the pitch interval P2 and the pitch interval P4 are equal to each other (P2=P4).

Similarly with the non-paired contacts GC, the external lands GL are ground lands for grounding.

In the above-described structure, the printed circuit board foot pattern 110 for a connector includes the land group 120 which is configured by metal foils, and which is to be solder connected to the contact group 30 of the connector 1, the land group 120 includes at least paired adjacent signal lands SL-SL, and external lands GL which are placed on the both adjacent sides or one adjacent side of the paired signal lands SL-SL, the paired signal lands SL-SL and the external lands GL are arranged so that the distance W3 between the paired signal lands SL-SL is shorter than the distance W4 between adjacent signal and external lands SL-GL, i.e., at "irregular pitches", and the external lands GL are ground lands.

Next, the functions of the connector 1 and the printed circuit board foot pattern 110 for a connector will be described.

When the connector 1 is to be mounted onto the printed circuit board 100, the connector is mounted onto a surface edge portion of the printed circuit board 100 while the four cover terminal portions 26 which are downward protruded from the four corners of the lower surface of the body 10 are inserted into four through holes that are disposed in the printed circuit board 100, and that are not shown. At this time, the terminal portions 34 of the paired signal contacts SC-SC and the non-paired contacts GC which are ground contacts are placed on the lands SL-SL, GL of the foot pattern 110, respectively. In this state, the cover terminal portions 26 and the through holes into which the cover terminal portions are inserted are fixed and connected to each other by soldering, and the lands SL-SL, GL and the terminal portions 34 which are placed thereon are fixed and connected to each other by soldering.

When the connector 1 is mounted onto the printed circuit board 100, the cover 20 is ground-connected to the printed circuit board 100, the paired signal contacts SC-SC are connected to signal lines (printed wiring) of the printed circuit board 100 through the terminal portions 34 of the contacts and the paired signal lands SL-SL, and the non-paired contacts GC which are ground contacts are connected to ground lines (printed wiring) of the printed circuit board 100 through the terminal portions 34 of the contacts and the external lands GL which are ground lands.

When the counter connector is then fitted and connected to the connector 1 which is mounted onto the printed circuit board 100, the contacting portion 29 of the contact piece 28 of the connector 1 is engaged and contacted with an engaging portion disposed in a metal shell (shield) which covers a counter fitting portion, whereby the connector 1 and the counter connector are prevented from being accidentally separated from each other, and the metal shell is ground-connected to the printed circuit board 100 through the cover 20 as a countermeasure against EMI. The paired signal contacts SC-SC are connected to counter contacts through the contact portions 32 of the contacts, so that the connected counter contacts are connected to the signal lines of the printed circuit board 100. The non-paired contacts GC which are ground contacts are connected to counter contacts through the contact portions 32 of the contacts, so that the connected counter contacts are connected to the ground line of the printed circuit board 100.

Therefore, differential lines (differential signal transmission paths) which pass through the paired signal contacts SC-SC of the connector 1 and the paired signal lands SL-SL of the foot pattern 110 are configured between the electronic apparatuses.

Figure 11B:
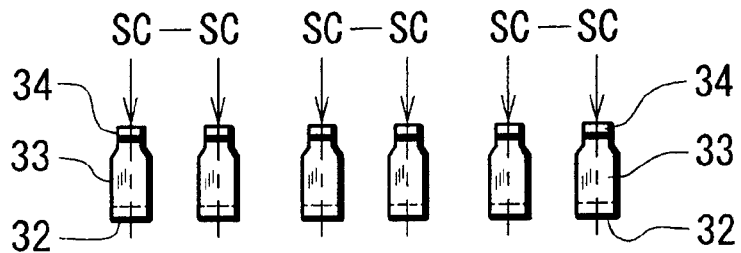
FIG. 11 illustrates three views showing a contact group of a connector of a reference example, (A) is a plan view, (B) is a back view, and (C) is a right side view.
Figure 11A:
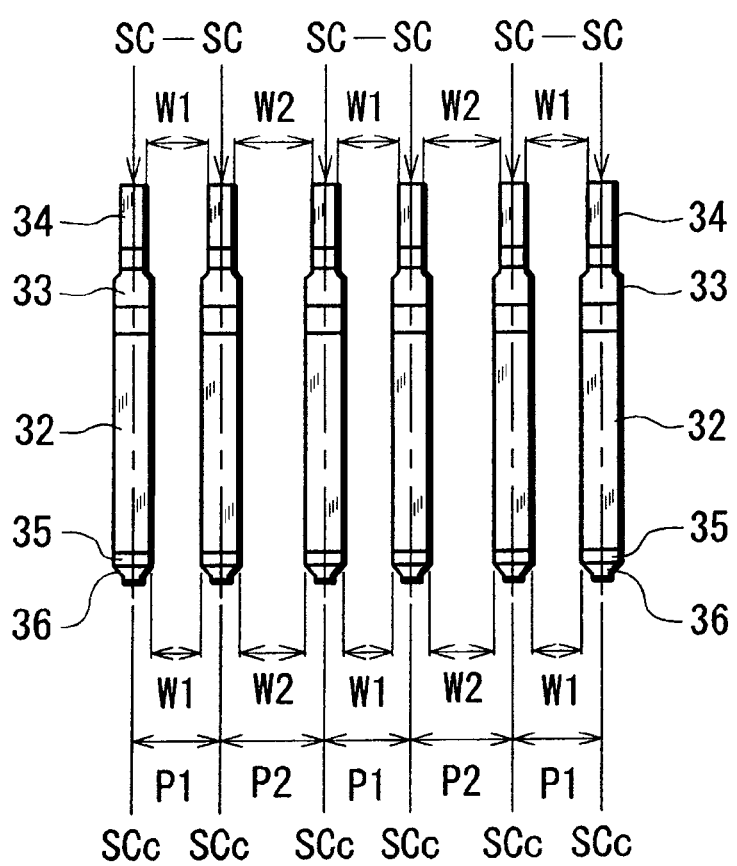
Figure 11C:
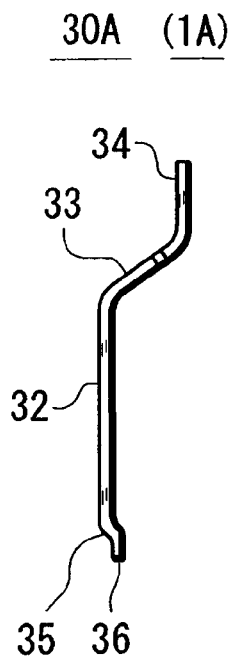

In this case, in the connector 1, the paired signal contacts SC-SC and the non-paired contacts GC are, in the range extending from the terminal portion 34 to the contact portion 32, in parallel to the anteroposterior direction which is the fitting/unfitting direction of the connector 1 and the counter connector, and arranged in the lateral direction which is the pitch direction that is perpendicular to the fitting/unfitting direction so that the distance W1 between the paired signal contacts SC-SC is shorter than the distance W2 between adjacent signal and non-paired contacts SC-GC, i.e., at "irregular pitches". Therefore, crosstalk from the signal contacts SC to the non-paired contacts GC can be suppressed in the range extending from the terminal portions 34 to the contact portions 32, the differential coupling force between the paired signal contacts SC-SC can be enhanced in the range extending from the terminal portions 34 to the contact portions 32, and, since the non-paired contacts GC are ground contacts, the crosstalk can be further suppressed as compared with a contact group 30A of a connector 1A of a reference example shown in (A), (B), and (C) of FIG. 11, i.e., the contact group 30A which is different only in that the non-paired contacts GC that are ground contacts are not disposed, and which are identical with the contact group 30 of the connector 1 in the other structures (the identical structures are denoted by the same reference numerals, and their description is omitted). As a result, the differential coupling can be firmly maintained in the range extending from the connection portion (terminal portion 34) for the printed circuit board 100 that is the connection object outside the connector 1, to the connection portion (contact portion 32) for the counter connector in the connector 1, impedance mismatching due to the connector 1 can be avoided, and a high-speed differential signal can be efficiently transmitted.

Figure 12:
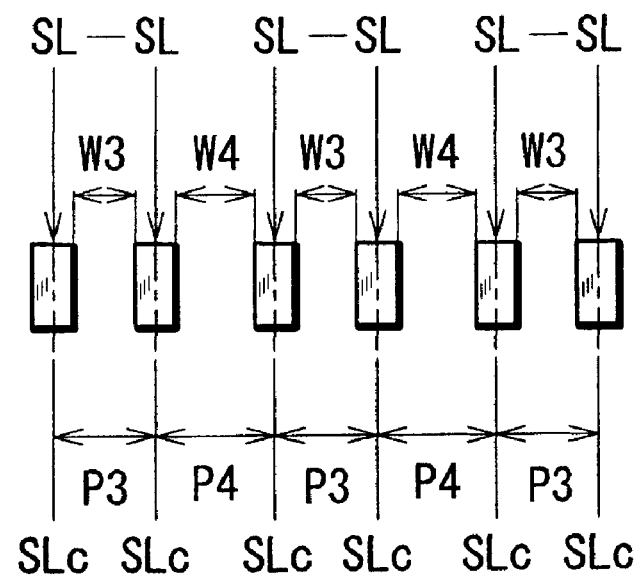
FIG. 12 is a plan view showing a printed circuit board foot pattern for a connector in a reference example.

In the printed circuit board foot pattern 110 for a connector, the paired adjacent signal lands SL-SL and the external lands GL are arranged so that the distance W3 between the paired signal lands SL-SL is shorter than the distance W4 between adjacent signal and external lands SL-GL, i.e., at "irregular pitches". Therefore, crosstalk from the signal lands SL to the external lands GL can be suppressed, the differential coupling force between the paired signal lands SL-SL can be enhanced, and, since the external lands GL are ground lands, the crosstalk can be further suppressed as compared with a printed circuit board foot pattern 110A for a connector of a reference example shown in FIG. 12, i.e., the printed circuit board foot pattern 110A for a connector which is different only in that the external lands GL that are ground lands are not disposed, and which are identical with the printed circuit board foot pattern 110 for a connector in the other structures (the identical structures are denoted by the same reference numerals, and their description is omitted). As a result, the differential coupling can be firmly maintained in the foot pattern 110 that is the connection portion between the connector 1 and the printed circuit board 100, impedance mismatching due to the foot pattern 110 can be avoided, and a high-speed differential signal can be efficiently transmitted.

In the differential transmission, dimensional errors of the distance W1 between the paired signal contacts SC-SC and the distance W2 between the adjacent signal and non-paired contacts SC-GC become more severe as the signal speed is higher. In the connector 1, the paired signal contacts SC-SC and the non-paired contacts GC are, in the range extending from the terminal portion 34 to the contact portion 32, in parallel to the anteroposterior direction which is the fitting/unfitting direction of the connector 1 and the counter connector, and arranged in the lateral direction which is the pitch direction that is perpendicular to the fitting/unfitting direction so that the distance W1 between the paired signal contacts SC-SC is shorter than the distance W2 between adjacent signal and non-paired contacts SC-GC, i.e., at irregular pitches. Therefore, the signal contacts SC and the non-paired contacts GC coincide in shape with each other, so that, in the insert molding, the dies can be easily produced, and the accuracy can be readily attained, and the distances W1, W2 can be obtained easily and accurately.

Although the embodiment of the invention has been described with reference to a receptacle of a connector for connecting electronic apparatuses together, the invention is not limited thereto, and may be variously modified without departing from the spirit of the invention. Namely, the invention may be applied also to a plug of a connector for connecting electronic apparatuses together. Alternatively, the invention may be applied also to a receptacle or plug of a connector for connecting printed circuit boards in an electronic apparatus together, or connecting a printed circuit board with a specific base member. Although, in the embodiment, the contacts of the connector are insert-molded to the body, the contacts may be attached to the body by press insertion. In the embodiment, the terminal portions of contacts of the connector, and the lands of the printed circuit board foot pattern for a connector are used for surface mounting. In the connector and printed circuit board foot pattern for a connector of the invention, however, the terminal portions and the lands may be used for insertion mounting. In the connector and printed circuit board foot pattern for a connector of the invention, it is a matter of course that contacts and lands for power supply, and contacts and lands for a single-end signal may be adequately added.

DESCRIPTION OF REFERENCE NUMERALS 1 connector
10 body (insulator)
30 contact group
31a to 31i contact
32 contact portion
34 terminal portion
SC signal contact
GC non-paired contact (ground contact)
W1 distance between SC-SC
W2 distance between SC-GC
100 printed circuit board (connection object)
110 foot pattern
120 land group
121a to 121i land
SL signal land
GL external land (ground land)
W3 distance between SL-SL
W4 distance between SL-GL

What is claimed is:

1. A connector wherein
said connector includes a contact group, and an insulator which holds said contact group,
said contact group includes at least paired adjacent signal contacts, and non-paired contacts which are placed on both adjacent sides or one adjacent side of the paired signal contacts,
each of said paired signal contacts and said non-paired contacts has a terminal portion which is to be connected to a connection object, and a contact portion which is to be connected to a counter contact, said paired signal contacts and said non-paired contacts are, in a range extending from said terminal portion to said contact portion, in parallel to a fitting/unfitting direction of said connector and said counter connector, and arranged in a pitch direction which is perpendicular to the fitting/unfitting direction so that a distance between said paired signal contacts is shorter than a distance between said signal contact and said non-paired contact, and
said non-paired contacts are ground contacts; wherein:
a downward step portion is formed in the vicinity of the front end of the contact portion, an embedded portion is configured by a front end portion of the contact portion that is on the front side of the step portion; and,
the embedded portions of the non-paired contacts extend beyond the embedded portions of the paired signal contacts in the fitting/unfitting direction of the counter connector.

2. The connector according to claim 1, wherein
said connection object is a printed circuit board having a foot pattern including a land group which is configured by metal foils, and which is to be solder connected to said contact group.

3. A printed circuit board foot pattern for a connector according to claim 1, wherein
said foot pattern includes a land group which is configured by metal foils, and which is to be solder connected to a contact group of said connector,
said land group includes at least paired adjacent signal lands, and external lands which are placed on both adjacent sides or one adjacent side of said paired signal lands,
said paired signal lands and said external lands are arranged so that a distance between said paired signal lands is shorter than a distance between said signal land and said external land, and
said external lands are ground lands.

4. A printed circuit board foot pattern for a connector according to claim 2, wherein
said land group includes at least paired adjacent signal lands, and external lands which are placed on both adjacent sides or one adjacent side of said paired signal lands,
said paired signal lands and said external lands are arranged so that a distance between said paired signal lands is shorter than a distance between said signal land and said external land, and
said external lands are ground lands.

* * * * *